United States Patent [19]
Yaoita

[11] Patent Number: 5,895,236
[45] Date of Patent: Apr. 20, 1999

[54] SEMICONDUCTOR DEVICE FABRICATING METHOD HAVING A GETTERING STEP

[75] Inventor: Akihiro Yaoita, Tokyo, Japan

[73] Assignee: NEC Corporation, Tokyo, Japan

[21] Appl. No.: 08/951,000

[22] Filed: Oct. 15, 1997

[30] Foreign Application Priority Data

Oct. 18, 1996 [JP] Japan ................... 8-276067

[51] Int. Cl.⁶ ........................... H01L 21/8232
[52] U.S. Cl. ............. 438/143; 438/471; 438/476; 438/402; 438/310
[58] Field of Search ................... 438/471, 476, 438/143, 310, 402; 148/DIG. 60

[56] References Cited

U.S. PATENT DOCUMENTS

| | | | |
|---|---|---|---|
| 4,608,096 | 8/1986 | Hill | 438/476 |
| 4,766,086 | 8/1988 | Ohshima et al. | 438/474 |
| 4,824,698 | 4/1989 | Jastrzebski et al. | 438/476 |
| 5,360,748 | 11/1994 | Nadahara et al. | 438/476 |

FOREIGN PATENT DOCUMENTS 61-159741  7/1986  Japan.

*Primary Examiner*—Trung Dang
*Attorney, Agent, or Firm*—Young & Thompson

[57] ABSTRACT

A device isolation region and a gate oxide film are formed on a front surface of a silicon substrate, with a gate electrode formed on the gate oxide film. Next, an interlayer insulator film is formed on their entire surfaces. Then, polycrystalline silicon film is grown on the rear surface of the silicon substrate. The polycrystalline silicon film is deposited in such a way as to be in contact with the rear surface of the substrate. Then, to permit the polycrystalline silicon film formed at the rear surface of the silicon substrate to getter a pollution heavy metal, a heat treatment is performed for the substrate at a temperature of 500 to 900° C. After this gettering process, an interconnection line is formed on the interlayer insulator film.

12 Claims, 3 Drawing Sheets

5,895,236

SEMICONDUCTOR DEVICE FABRICATING METHOD HAVING A GETTERING STEP

BACKGROUND OF THE INVENTION

1. Field of the Invention

The present invention relates to a semiconductor device fabricating method having a gettering step, which can efficiently remove a pollution heavy metal in a silicon substrate.

2. Description of the Related Art

In the fabrication of semiconductor devices, a pollution heavy metal, such as iron or nickel, which is introduced into a substrate leads to an increase in leakage current at the junction between the substrate and an electrode, and a reduction of charges stored in the charge holding portion of a DRAM, and so forth, which adversely affect the perfomance of semiconductor devices. One of known ways of reducing such heavy metal pollution is to make the semiconductor-device production line clean to thereby reduce the amount of a pollution heavy metal introduced during fabrication of semiconductor devices. Another way which has been proposed to reduce such pollution is a gettering step capable of eliminating a pollution heavy metal introduced in a substrate, from the substrate (Unexamined Japanese Patent Publication No. Sho 61-159741).

FIGS. 1A through 1D are cross-sectional views illustrating a step by step semiconductor device fabricating method having a conventional gettering step. As shown in FIG. 1A, first, a silicon substrate 301 is oxidized to form silicon oxide films 302a and 302b at its front and rear surfaces.

Next, as shown in FIG. 1B, only the silicon oxide film 302b at the rear surface of the silicon substrate 301 is removed to expose the rear surface of the silicon substrate 301.

Then, as shown in FIG. 1C, a polycrystalline silicon film 303 for a gate electrode is grown on the silicon oxide film 302a and a polycrystalline silicon film 304 is grown on the rear surface of the silicon substrate 301 as one step in the normal semiconductor device fabrication. The growth of the polycrystalline silicon film 304 gives stress to the substrate 301, thus crystal defects are produced in the substrate 301.

Thereafter, as shown in FIG. 1D, an impurity 305, such as phosphorus is introduced into the polycrystalline silicon film 303 for the gate electrode to impart conductivity to this polycrystalline silicon film 303, and it is also introduced into the polycrystalline silicon film 304. Then, the impurity introduced in the polycrystalline silicon film 304 is diffused into the substrate 301 from the polycrystalline silicon film 304. As a result, SiP or the like is produced in the substrate 301, causing deformation in the substrate 301. Thereafter, the substrate 301 is subjected to a heat treatment as one step in the normal semiconductor device fabrication.

The above-described process can permit a heavy metal, such as molybdenum or tungsten, present in the substrate 301 to be caught in the crystal defects and deformation as well as in the polycrystalline silicon film 304.

Even when a semiconductor device is manufactured by the above-described fabrication method, however, it is not possible to sufficiently getter the pollution heavy metal from the substrate 301 for the reason given below. In accordance with the recent increase in integration and miniaturization of semiconductor devices, the polycrystalline silicon film 303 for the gate electrode formed on the front surface of the silicon oxide film 302a on the silicon substrate 301 is thinner. The polycrystalline silicon film 304 formed at the rear of the substrate 301 is also thinner, thus reducing the stress which is given to the substrate 301. As a result, the amount of crystal defects formed in the substrate 301 is reduced, reducing the gettering effect. This is because the polycrystalline silicon film 304 is a thin film, and the diffusion of an impurity like phosphorus in the polycrystalline silicon film 304 reduces the amount of grain boundaries in the polycrystalline silicon film 304. Further, according to the conventional fabrication method, the heat treatment to getter a pollution heavy metal is a heat treatment which is normally performed in the fabrication of a semiconductor device. Since this heat treatment is performed several times, however, even if a pollution heavy metal is caught in the substrate 301 in a single heat treatment, the caught pollution heavy metal may be set free again in the next heat treatment. As apparent from the above, the use of the conventional fabrication method cannot remove a pollution heavy metal from the substrate 301 sufficiently.

SUMMARY OF THE INVENTION

Accordingly, it is an object of the present invention to provide a semiconductor device fabricating method having a gettering step capable of improving the effect of gettering a pollution heavy metal present in a substrate, thereby enhancing the performance of a manufactured semiconductor device.

A semiconductor device fabricating method having a gettering step according to this invention comprises a step of forming an insulator film on a first surface of a semiconductor substrate having a second surface opposite to the first surface. Next, a first polycrystalline silicon film is formed on the second surface of the semiconductor substrate. The first polycrystalline silicon film is in contact with the second surface. Then, the semiconductor substrate is subjected to a heat treatment. This step permits a pollution heavy metal in the semiconductor substrate to be gettered into the first polycrystalline silicon film. Then, an interconnection line is formed on the first surface of the semiconductor substrate.

The insulator film may be an interlayer insulator film. The semiconductor device fabricating method embodying this invention may have a step of forming a second polycrystalline silicon film on the insulator film at the same time as the step of forming the first polycrystalline silicon film. In this case, the semiconductor device fabricating method can have a step of removing the second polycrystalline silicon film prior to the step of performing the heat treatment for the semiconductor substrate. This second polycrystalline silicon film may be removed after the step of performing the heat treatment for the semiconductor substrate. Further, the surface of the insulator film may be etched out to be flattened at the same time as the step of removing the second polycrystalline silicon film.

Further, the semiconductor device fabricating method according to this invention may have a step of removing the first polycrystalline silicon film between the step of performing the heat treatment for the semiconductor substrate and the step of forming the interconnection line. Furthermore, the first polycrystalline silicon film can have a thickness of 0.2 to 1.0 μm. Moreover, the semiconductor substrate may be subjected to a heat treatment at a temperature of 500 to 900° C.

According to this invention, the first polycrystalline silicon film is grown on the second surface of the semiconductor substrate and is then subjected to a heat treatment, so that a pollution heavy metal in the substrate is diffused and this pollution heavy metal is gettered in the first polycrystalline silicon film. In this invention, because the first polycrystalline silicon film is formed on the second surface of the semiconductor substrate during a step other than the step of forming a gate electrode or the like on the first surface of the semiconductor substrate, the thickness of the first polycrystalline silicon film does not depend on the thickness of the gate electrode or the like. Therefore, the first polycrystalline silicon film can be formed to the desired thickness to improve the effect of gettering a pollution heavy metal as compared with the conventional fabrication method.

According to this invention, the first polycrystalline silicon film is formed prior to the formation of an interconnection line and is then subjected to a heat treatment for gettering. Because there is no high-temperature heat treatment after an ordinary step of forming an interconnection line, no additional heat treatment is performed for the substrate after the gettering heat treatment. It is therefore possible to prevent the pollution heavy metal, caught in the first polycrystalline silicon film, from being released again.

DETAILED DESCRIPTION OF THE PREFERRED EMBODIMENTS

Figure 1A:
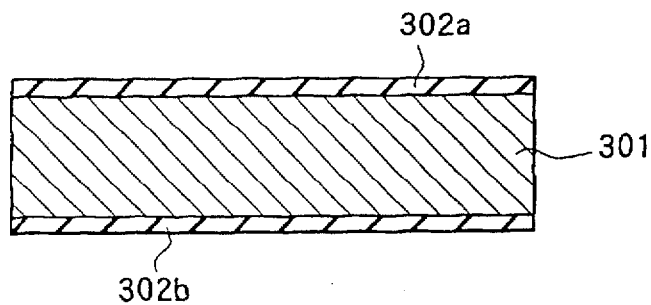
FIGS. 1A through 1D are cross-sectional views illustrating a step by step semiconductor device fabricating method having a conventional gettering step.
Figure 1B:
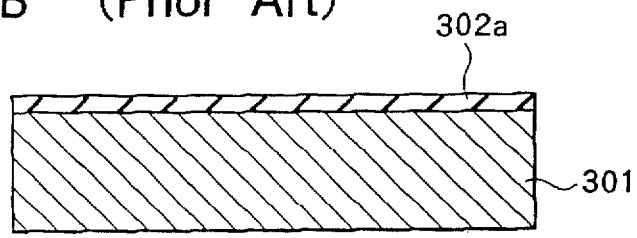
Figure 1C:
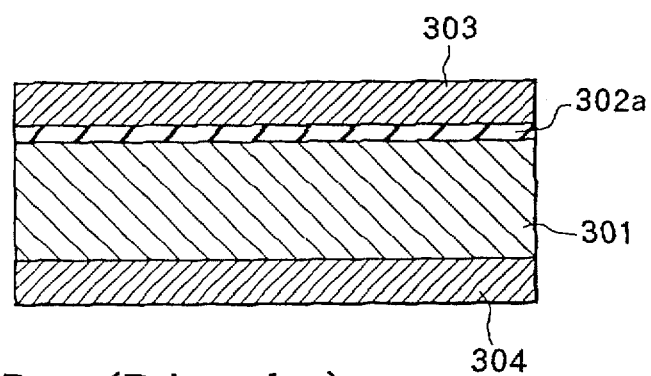
Figure 1D:
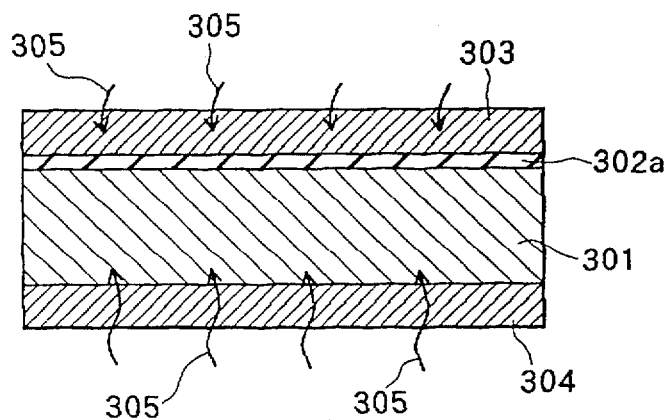
Figure 2A:
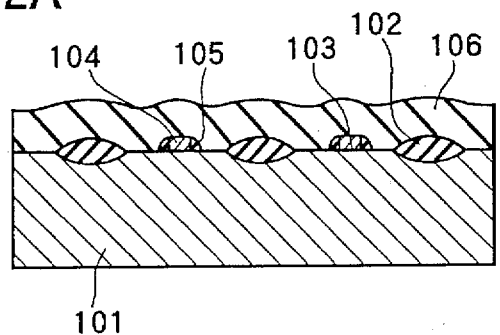
FIGS. 2A through 2D are cross-sectional views illustrating a step-by-step semiconductor device fabricating method according to the first embodiment of this invention.

Preferred embodiments of the present invention will now be described specifically with reference to the accompanying drawings. FIGS. 2A through 2D are cross-sectional views illustrating a step-by-step semiconductor device fabricating method according to the first embodiment of this invention. First, as shown in FIG. 2A, a device isolation region 102 is selectively formed at the front surface (first surface) of a silicon substrate (semiconductor substrate) 101 by LOCOS using an ordinary semiconductor device fabricating method. Then, a gate oxide film 103 is grown 8 nm thick on the surface of the device region defined by the device isolation region 102, by oxidizing the front surface of the silicon substrate 101.

Next, a polycrystalline silicon film (not shown) is formed 30 nm thick on the gate oxide film 103, and the polycrystalline silicon film is patterned by photolithography and dry etching, thereby forming a gate electrode 104. Then, a side-wall insulator film 105 is formed on the side wall of the gate electrode 104. Then, an interlayer insulator film (insulator film) 106 is formed on their entire surfaces. It is to be noted that this interlayer insulator film 106 is an insulator film which is formed before the formation of an interconnection line.

Figure 2B:
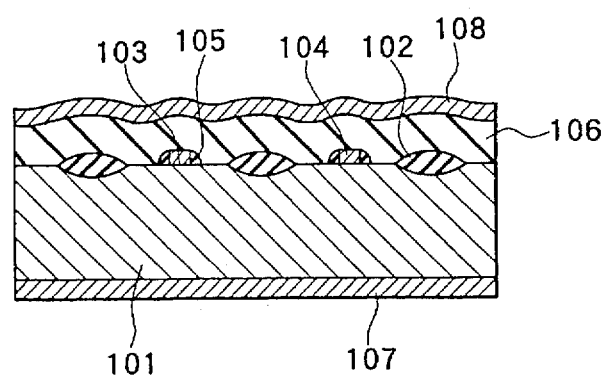

Thereafter, as shown in FIG. 2B, polycrystalline silicon films 108 and 107 are respectively formed on the interlayer insulator film 106 and the rear surface (second surface) of the silicon substrate 101 by chemical vapor deposition. The polycrystalline silicon film (first polycrystalline silicon film) 107 which is formed on the rear surface of the silicon substrate 101 is deposited in such a way as to be in contact with the rear surface of the substrate 101. The thicknesses of the polycrystalline silicon films 107 and 108 are not particularly limited as long as the stress of those films does not deform the silicon substrate 101 and does not affect the subsequent steps. In view of gettering effect, however, it is preferable that the thicknesses of the polycrystalline silicon films 107 and 108 is in a range of 0.2 to 1 μm.

Figure 2C:
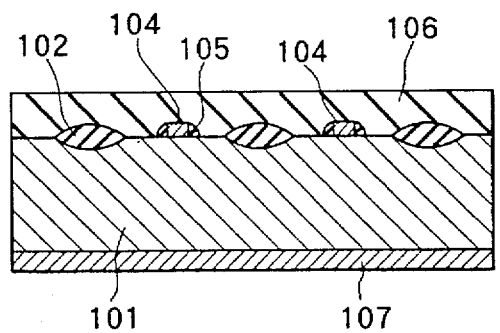

Then, as shown in FIG. 2C, only the polycrystalline silicon film (second polycrystalline silicon film) 108 on the interlayer insulator film 106 is removed. The polycrystalline silicon film 108 may be eliminated by CMP (Chemical Mechanical Polishing), for example. CMP is a typical step which is taken to flatten the interlayer insulator film 106. In the step of flattening the interlayer insulator film 106, therefore, the use of a solution for the polycrystalline silicon film can permit the removal of the polycrystalline silicon film 108 and the flattening of the interlayer insulator film 106 to be conducted simultaneously. There is no need for a special step of removing the polycrystalline silicon film 108. Note that the polycrystalline silicon film 108 may be etched out by dry etching.

Then, in order to make a pollution heavy metal gettered in the polycrystalline silicon film 107 formed on the rear surface of the silicon substrate 101, a heat treatment is performed for this polycrystalline silicon film 107. While this heat treatment is conducted at a temperature of 500 to 900° C., it is preferable that the heat treatment should be carried out longer for a lower treatment temperature in consideration of the distance of diffusion of the pollution heavy metal in the silicon substrate 101. To getter iron, for example, iron can sufficiently be gettered in the polycrystalline silicon film 107 on the rear surface of the silicon substrate 101 by a heat treatment for ten minutes since the diffusion coefficient of iron in the silicon substrate 101 at 900° C. is approximately $2\times10^{-6}$ (cm$^2$/sec).

Figure 2D:
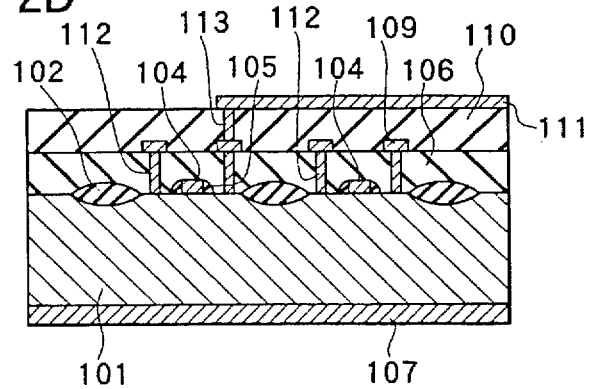

After the above gettering process, an interconnection line is formed as shown in FIG. 2D. Specifically, a through hole reaching the front surface of the silicon substrate 101 from the front surface of the interlayer insulator film 106 is formed, and is then buried with a conductive film 112. Then, a first interconnection line 109 is selectively formed on the interlayer insulator film 106 at the position where it contacts the conductive film 112. This allows the device region of the silicon substrate 101 to be electrically connected to the first interconnection line 109 via the through hole. In the case of forming a multi-layer interconnection line as needed, an interlayer insulator film 110 is formed on the front surface of the resultant structure and a through hole is selectively formed in such a way that the through hole reaches the first interconnection line 109 from the front surface of this interlayer insulator film 110. Then, this through hole is buried with a conductive film 113. Then, a second interconnection line 111 is selectively formed on the interlayer insulator film 110 at the position where it contacts the conductive film 113. This allows the first interconnection line 109 and the second interconnection line 111 to be electrically connected together via the through hole.

According to the first embodiment which has the above-described fabrication steps, the polycrystalline silicon film 107 is grown on the rear surface of the silicon substrate 101, and is subjected to a heat treatment to diffuse the pollution heavy metal in the substrate 101, thereby permitting the pollution heavy metal to be gettered in the polycrystalline silicon film 107. Since the gettering effect depends on the amount of the grain boundaries in the polycrystalline silicon film 107 according to this gettering method, it is preferable to form a polycrystalline silicon film having a lot of grain boundaries on the rear surface of the silicon substrate 101.

The thicker the polycrystalline silicon film 107, the greater the amount of grain boundaries becomes. According to this embodiment, the thickness of the polycrystalline silicon film 107 to be formed on the rear surface of the silicon substrate 101 does not depend on the thickness of the gate electrode or the like, so that the polycrystalline silicon film 107 can be formed to the desired thickness. This is because even if the polycrystalline silicon film 108 is formed on the front surface of the silicon substrate 101, this film 108 only can be removed by etching or CMP. According to this embodiment, therefore, the polycrystalline silicon film 107 can be formed to the desired thickness, thus improving the effect of gettering a pollution heavy metal.

Because the removal of the polycrystalline silicon film 108 by CMP can allow the flattening of the interlayer insulator film 106 and the removal of the polycrystalline silicon film 108 to be carried out simultaneously, there is no need for a special step of removing the polycrystalline silicon film 108.

Generally, as a crystal in the polycrystalline silicon film is the smallest immediately after growth of the polycrystalline silicon film, lots of grain boundaries are present in the polycrystalline silicon film. A process like a heat treatment causes recrystallization of the polycrystalline silicon film, thus reducing the grain boundaries. The reduction in grain boundaries may cause the pollution heavy metal, caught in the boundaries, to be set free, and impairs the gettering effect in the subsequent step.

According to this embodiment, the polycrystalline silicon film 107 is formed directly before the step of forming the first interconnection line 109, and is subjected to a heat treatment for gettering. Since there is no high-temperature heat treatment after the step of forming an interconnection line in the ordinary fabrication of a semiconductor device, no additional heat treatment is performed for the substrate 101 after the gettering heat treatment. It is therefore possible to prevent the caught pollution heavy metal from being released again. The use of the method of this embodiment to fabricate a semiconductor device can improve the performance of that device.

If the provision of a through hole in the interlayer insulator film 106 requires a heat treatment for the substrate 101, it is unnecessary to particularly provide a step of performing a heat treatment for the polycrystalline silicon film 107.

Figure 3A:
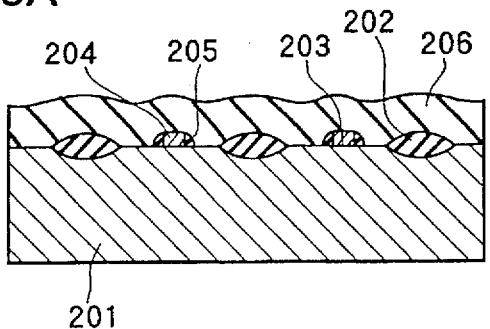
FIGS. 3A through 3D are cross-sectional views illustrating a step-by-step semiconductor device fabricating method according to the second embodiment of this invention.

FIGS. 3A through 3D are cross-sectional views illustrating a step-by-step semiconductor device fabricating method according to the second embodiment of this invention. As shown in FIG. 3A, first, a device isolation region 202 is selectively formed on the front surface (first surface) of a silicon substrate (semiconductor substrate) 201 as per the first embodiment. Then, a gate oxide film 203 is grown on the surface of the device region, defined by the device isolation region 202. Next, a gate electrode 204 is selectively formed on the gate oxide film 203. Then, a side-wall insulator film 205 is formed on the side wall of the gate electrode 204. Then, an interlayer insulator film (insulator film) 206 is formed on their entire surfaces.

Figure 3B:
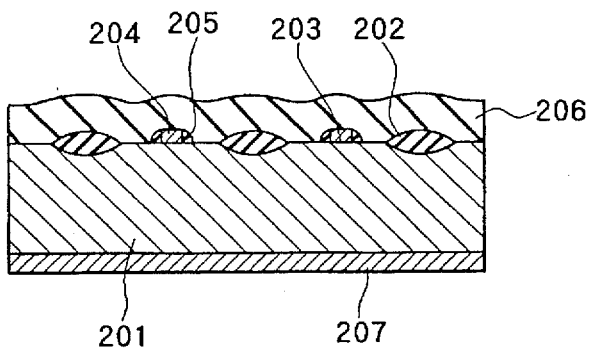

Thereafter, a polycrystalline silicon film (first polycrystalline silicon film) 207 which is in direct contact with the silicon substrate 201 is formed only on the rear surface (second surface) of the silicon substrate 201 as shown in FIG. 3B. Then, this polycrystalline silicon film 207 is subjected to a heat treatment so that a pollution heavy metal present in the substrate 201 is gettered in the polycrystalline silicon film 207.

Figure 3C:
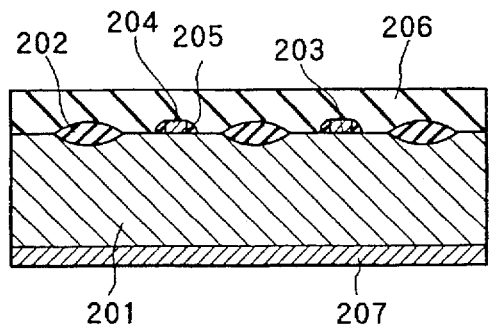

Then, an interconnection line is formed on the interlayer insulator film 206 as specifically discussed below. As shown in FIG. 3C, the front surface of the interlayer insulator film 206 is flattened.

Figure 3D:
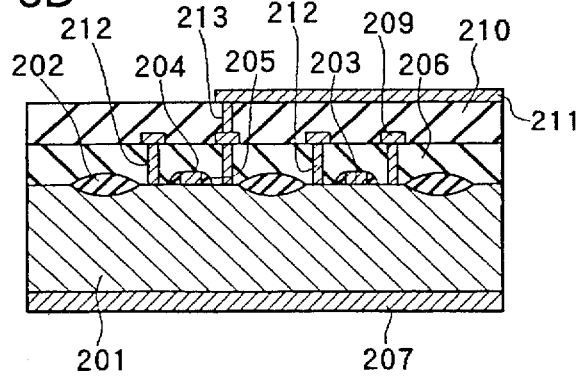

Next, a through hole reaching the front surface of the silicon substrate 201 from the front surface of the interlayer insulator film 206 is formed, and is then buried with a conductive film 212, as shown in FIG. 3D. Then, a first interconnection line 209 is selectively formed on the interlayer insulator film 206 at the position where it contacts the conductive film 212. This allows the device region of the silicon substrate 201 to be electrically connected to the first interconnection line 209 via the through hole. In the case of forming a multi-layer interconnection line as needed, an interlayer insulator film 210 is formed on the front surface of the resultant structure and a through hole is selectively formed in such a way that the through hole reaches the first interconnection line 209 from the front surface of this interlayer insulator film 210. Then, this through hole is buried with a conductive film 213. Then, a second interconnection line 211 is selectively formed on the interlayer insulator film 210 at the position where it contacts the conductive film 213. This allows the first interconnection line 209 and the second interconnection line 211 to be electrically connected together via the through hole.

According to the second embodiment which has the above-described fabrication steps, the polycrystalline silicon film 207 can be formed to the desired thickness on the rear surface of the silicon substrate 201, so that the effect of gettering the pollution heavy metal can be improved as in the first embodiment.

According to the first and second embodiments, the polycrystalline silicon films 107 and 207 deposited on the rear surfaces of the silicon substrates 101 and 201 may be removed after a heat treatment but before the formation of an interconnection line. In this case, the rear of the silicon substrate 101 (201) can be etched out to the depth of 50 to 100 nm at the same time as the polycrystalline silicon film 107 (207) is removed. It is therefore possible to eliminate the gettered pollution heavy metal remaining in the vicinity of the rear surface of the substrate 101 (201) and to prevent this pollution heavy metal from being released into the substrate 101 (201) again in the subsequent steps.

This invention is not limited to the first and second embodiments illustrated in FIGS. 2A–2D and FIGS. 3A–3D, but may be modified in various forms within the scope and spirit of the invention.

What is claimed is:

1. A semiconductor device fabricating method having a gettering step, comprising the steps of:

forming an insulator film on a first surface of a semiconductor substrate having a second surface opposite to said first surface;

forming a first polycrystalline silicon film on said second surface of said semiconductor substrate in contact with said second surface;

forming a second polycrystalline silicon film on said insulator film at the same time as said step of forming said first polycrystalline silicon film;

performing a heat treatment for said semiconductor substrate to permit a pollution heavy metal in said semiconductor substrate to be gettered into said first polycrystalline silicon film;

removing said second polycrystalline silicon film prior to or after said step of performing the heat treatment for the semiconductor substrate; and forming an interconnection line on said first surface of said semiconductor substrate.

2. The method according to claim 1, wherein said insulator film is an interlayer insulator film.

3. The method according to claim 1, further comprising a step of etching out a surface of said insulator film to flatten said surface thereof at the same time as said step of removing said second polycrystalliine silicon film.

4. The method according to claim 1, further comprising a step of removing said first polycrystalline silicon film between said step of performing said heat treatment for said semiconductor substrate and said step of forming said interconnection line.

5. The method according to claim 4, further comprising a step of etching out said second surface of said semiconductor substrate to a depth of 50 to 100 nm at the same time as said step of removing said first polycrystalline silicon film.

6. The method according to claim 1, wherein said first polycrystalline silicon film has a thickness of 0.2 to 1.0 µm.

7. The method according to claim 1, wherein said semiconductor substrate is subjected to a heat treatment at a temperature of 500 to 900° C.

8. The method according to claim 1, further comprising the steps of:

forming a device isolation region at said first surface of said semiconductor substrate before said step of forming said insulator film, thereby defining a device region at said first surface of said semiconductor substrate;

forming a gate insulator film on a surface of said device region; and selectively forming a gate electrode on said gate insulator film.

9. The method according to claim 8, further comprising a step of forming a side-wall insulator film on a side wall of said gate electrode.

10. The method according to claim 8, wherein said gate electrode is formed of a polycrystalline silicon film.

11. The method according to claim 10, wherein said first polycrystalline silicon film is thicker than said gate electrode.

12. The method according to claim 8, wherein said step of forming said interconnection line includes the steps of:

selectively forming a through hole in said insulator film, said through hole reaching said device region;

burying said through hole with a conductive film; and forming an interconnection line on said insulator film at a position where said interconnection line contacts said conductive film.

* * * * *